(12) United States Patent
Wong et al.

(10) Patent No.: US 12,464,800 B2
(45) Date of Patent: Nov. 4, 2025

(54) SEMICONDUCTOR DEVICE

(71) Applicant: Sumitomo Electric Device Innovations, Inc., Yokohama (JP)

(72) Inventors: James Wong, Yokohama (JP); Kento Kawasaki, Yokohama (JP)

(73) Assignee: Sumitomo Electric Device Innovations, Inc., Yokohama (JP)

( * ) Notice: Subject to any disclaimer, the term of this patent is extended or adjusted under 35 U.S.C. 154(b) by 326 days.

(21) Appl. No.: 17/944,468

(22) Filed: Sep. 14, 2022

(65) Prior Publication Data

US 2023/0102118 A1    Mar. 30, 2023

(30) Foreign Application Priority Data

Sep. 29, 2021 (JP) .................. 2021-159114

(51) Int. Cl.
*H10D 64/23* (2025.01)
*H10D 62/10* (2025.01)
*H10D 64/27* (2025.01)

(52) U.S. Cl.
CPC ......... *H10D 64/254* (2025.01); *H10D 62/127* (2025.01); *H10D 64/257* (2025.01); *H10D 64/519* (2025.01)

(58) Field of Classification Search
CPC ............. H01L 29/4175; H01L 29/0696; H01L 29/41758; H01L 29/4238; H01L 23/4824; H01L 23/481; H10D 64/254; H10D 62/127; H10D 64/257; H10D 64/519
See application file for complete search history.

(56) References Cited

U.S. PATENT DOCUMENTS

| 6,252,266 B1 | 6/2001 | Hoshi et al. |
| 10,629,526 B1 * | 4/2020 | Hill ...................... H01L 25/072 |
| 2011/0084341 A1 | 4/2011 | Kosaka |
| 2019/0386126 A1 | 12/2019 | Zhang et al. |

(Continued)

FOREIGN PATENT DOCUMENTS

| JP | H6-338520 A | 12/1994 |
| JP | 08-148570 A | 6/1996 |

(Continued)

OTHER PUBLICATIONS

Extended European Search Report issued on Feb. 15, 2023 for European Patent Application No. 22196836.5.

*Primary Examiner* — Steven B Gauthier
*Assistant Examiner* — Khatib A Rahman
(74) *Attorney, Agent, or Firm* — Volpe Koenig (57) ABSTRACT

A semiconductor device includes a substrate having a front surface including a first long side and a second long side extending in a first direction and opposed to each other, and a first short side and a second short side extending in a second direction intersecting the first direction and opposed to each other, a source finger provided on the front surface, a drain finger provided on the front surface, and a gate finger provided on the front surface and sandwiched between the source finger and the drain finger, wherein a via hole penetrating the substrate is provided in the substrate, a region where the via hole is connected to the source finger in the front surface is contained within the source finger, and the via hole has a maximum width in the first direction larger than a maximum width in the second direction.

9 Claims, 11 Drawing Sheets

(56) References Cited

U.S. PATENT DOCUMENTS

| | | |
|---|---|---|
| 2020/0118922 A1 | 4/2020 | Hill |
| 2020/0152803 A1* | 5/2020 | Yamaguchi .......... H10D 64/112 |
| 2022/0020658 A1* | 1/2022 | Ohhashi ................ H01L 23/481 |
| 2022/0044986 A1* | 2/2022 | Khalil ..................... H01L 24/06 |
| 2022/0385246 A1* | 12/2022 | Kamioka ................ H01L 23/66 |
| 2023/0268343 A1* | 8/2023 | Wong ................ H01L 23/49844 |
| | | 257/368 |

FOREIGN PATENT DOCUMENTS

| | | |
|---|---|---|
| JP | 2000-332030 A | 11/2000 |
| JP | 2007-243018 A | 9/2007 |
| JP | 2009-289935 A | 12/2009 |
| JP | 2020-535627 A | 12/2020 |

\* cited by examiner

FIG. 6A
VIA HOLE B

FIG. 6B
VIA HOLE C

FIG. 6C
VIA HOLE D

FIG. 6D
VIA HOLE E

FIG. 6E
VIA HOLE F

SEMICONDUCTOR DEVICE

CROSS REFERENCE TO RELATED APPLICATIONS

This application claims priority based on Japanese Patent Application No. 2021-159114 filed on Sep. 29, 2021, and the entire contents of the Japanese patent applications are incorporated herein by reference.

FIELD

The present disclosure relates to a semiconductor device, for example, to a semiconductor device having a via hole in a source finger.

BACKGROUND

In a field effect transistor (FET) having a source electrode, a gate electrode, and a drain electrode provided on a substrate, it is known to provide a via hole penetrating the substrate in the source electrode (for example, Japanese Laid-open Patent Publication No. 8-148570). It is known that a via hole is provided in a pad connected to a source finger, and a long axis direction of the via hole is set to an extending direction of a long side of the surface of the substrate (for example, Japanese Laid-open Patent Publication No. 2009-289935).

SUMMARY

A semiconductor device according to the present disclosure includes: a substrate having a front surface including a first long side and a second long side extending in a first direction and opposed to each other, and a first short side and a second short side extending in a second direction intersecting the first direction and opposed to each other; a source finger provided on the front surface; a drain finger provided on the front surface; and a gate finger provided on the front surface and sandwiched between the source finger and the drain finger; wherein a via hole penetrating the substrate is provided in the substrate, a region where the via hole is connected to the source finger in the front surface is contained within the source finger, and the via hole has a maximum width in the first direction larger than a maximum width in the second direction.

DETAILED DESCRIPTION OF EMBODIMENTS

By providing a via hole in the source electrode, a crack originating from the via hole may occur in the substrate having the via hole due to thermal stress or the like at the time of mounting the substrate on a mounting substrate, and the substrate may be damaged.

In view of the above problems, it is an object of the present disclosure to suppress breakage of a substrate.

Description of Embodiments of the Present Disclosure

First, the contents of the embodiments of this disclosure are listed and explained. (1) One embodiment of the present disclosure is a semiconductor device including: a substrate having a front surface including a first long side and a second long side extending in a first direction and opposed to each other, and a first short side and a second short side extending in a second direction intersecting the first direction and opposed to each other; a source finger provided on the front surface; a drain finger provided on the front surface; and a gate finger provided on the front surface and sandwiched between the source finger and the drain finger; wherein a via hole penetrating the substrate is provided in the substrate, a region where the via hole is connected to the source finger in the front surface is contained within the source finger, and the via hole has a maximum width in the first direction larger than a maximum width in the second direction. As a result, a stress applied to the via hole is reduced, and damage to the substrate can be suppressed.

(2) The source finger, the drain finger, and the gate finger may extend in the first direction and be arranged in the second direction.

(3) The semiconductor device may further include a drain bus bar provided on the front surface and connected to an end closer to a first short side of both ends of each of a plurality of drain fingers, and a gate bus bar provided on the front surface and connected to an end closer to a second short side of both ends of each of a plurality of gate fingers.

(4) The substrate may include an active region in which a semiconductor layer in the substrate is activated, and an inactive region in which the semiconductor layer is inactivated. The source finger, the drain finger and the gate finger may be provided on the active region, and the drain bus bar and the gate bus bar may be provided on the inactive region.

(5) The semiconductor device may further include a drain pad provided on the front surface and connected to an end closer to the first long side of both ends of the drain bus bar, and a gate pad provided on the front surface and connected to an end closer to the second long side of both ends of the gate bus bar.

(6) The source finger may include a plurality of first source fingers arranged in the second direction, and a plurality of second source fingers arranged in the second direction and provided between the first short side and the plurality of first source fingers. The drain finger may include a plurality of first drain fingers arranged in the second direction, and a plurality of second drain fingers arranged in the second direction and provided between the first short side and the plurality of first drain fingers. The gate finger may include a plurality of first gate fingers arranged in the second direction, each of the first gate fingers being sandwiched between one of the plurality of first source fingers and one of the plurality of first drain fingers in the second direction, and a plurality of second gate fingers arranged in the second direction and provided between the first short side and the plurality of first gate fingers, each of the second gate fingers being sandwiched between one of the plurality of second source fingers and one of the plurality of second drain fingers in the second direction. The semiconductor device may include a gate bus bar connected to an end closer to the first short side of both ends of each of the plurality of first gate fingers and an end closer to the second short side of both ends of each of the plurality of second gate fingers, a first drain bus bar connected to an end closer to the second short side of both ends of each of the plurality of first drain fingers, and a second drain bus bar connected to an end closer to the first short side of both ends of each of the plurality of second drain fingers.

(7) The source finger may include a plurality of first source fingers arranged in the second direction, and a plurality of second source fingers arranged in the second direction and provided between the first short side and the plurality of first source fingers. The drain finger may include a plurality of first drain fingers arranged in the second direction, and a plurality of second drain fingers arranged in the second direction and provided between the first short side and the plurality of first drain fingers. The gate finger may include a plurality of first gate fingers arranged in the second direction, each of the first gate fingers being sandwiched between one of the plurality of first source fingers and one of the first drain fingers in the second direction, and a plurality of second gate fingers arranged in the second direction and provided between the first short side and the plurality of first gate fingers, each of the second gate fingers being sandwiched between one of the plurality of second source fingers and one of the plurality of second drain fingers in the second direction. The semiconductor device may include a drain bus bar connected to an end closer to the first short side of both ends of each of the plurality of first drain fingers and an end closer to the second short side of both ends of each of the plurality of second drain fingers, a first gate bus bar connected to an end closer to the second short side of both ends of each of the plurality of first gate fingers, and a second gate bus bar connected to an end closer to the first short side of both ends of each of the plurality of second gate fingers.

(8) The source finger, the drain finger, and the gate finger may extend in the second direction and be arranged in the first direction. A plurality of the via holes may be arranged in the second direction in one source finger.

(9) A planar shape of the via hole may be an elliptical shape, an oblong shape, an egg shape, or a rounded square shape.

(10) The semiconductor device may further include a metal layer provided on a rear surface of the substrate opposite to the front surface and electrically connected to the source finger via the via hole.

Details of Embodiments of the Present Disclosure

Specific examples of a semiconductor device in accordance with embodiments of the present disclosure are described below with reference to the drawings. The present disclosure is not limited to these examples, but is indicated by the claims, which are intended to include all modifications within the meaning and scope of the claims.

First Embodiment

Figure 1:
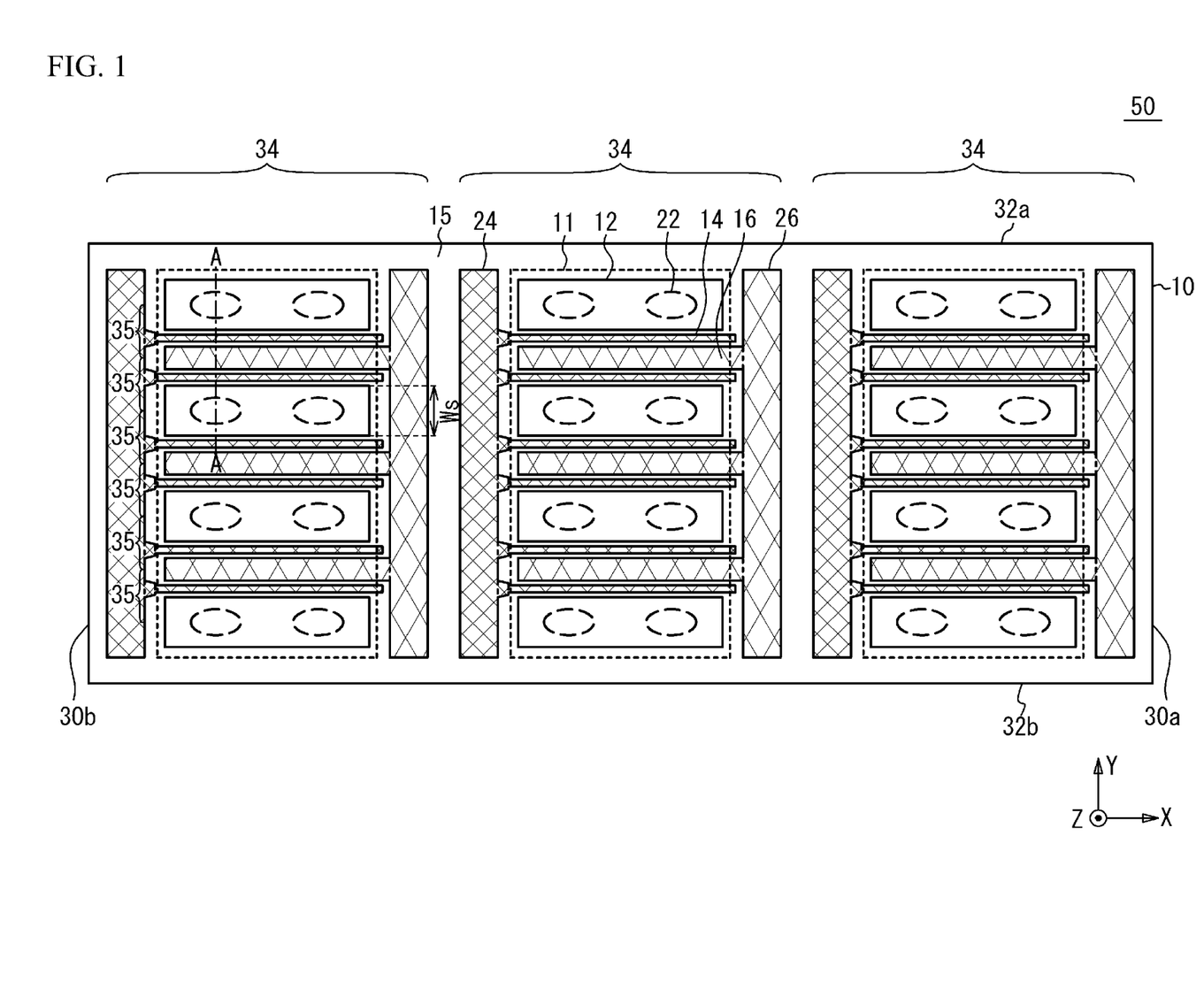
FIG. 1 is a plan view illustrating a semiconductor device according to a first embodiment.

FIG. 1 is a plan view illustrating a semiconductor device according to a first embodiment. A normal direction of a front surface 15 of a substrate 10 is defined as a Z direction, a direction in which a longer side of the front surface 15 of the substrate 10 extends is defined as a X direction, and a direction in which a shorter side of the front surface 15 of the substrate 10 extends is defined as a Y direction.

As illustrated in FIG. 1, the front surface 15 of the substrate 10 has a substantially rectangular shape, and long sides 32a (first long side) and 32b (second long side) opposing each other extend in the X direction (first direction), and short sides 30a (first short side) and 30b (second short side) opposing each other extend in the Y direction (second direction). As long as the first direction in which the long sides 32a and 32b extend and the second direction in which the short sides 30a and 30b extend intersect each other, they do not need to be orthogonal.

In the semiconductor device 50 of the first embodiment, a plurality of FET groups 34 are provided on the front surface 15 of the substrate 10. The number of FET groups 34 may be one or a plurality of pieces, and may be two or four or more. The FET groups 34 are arranged in the X direction. Each of the FET groups 34 includes a plurality of unit FETs 35. The unit FETs 35 are arranged in the Y direction. The number of unit FETs 35 in the FET group 34 may be a plurality of pieces.

An active region 11 is provided on the substrate 10. A region other than the active region 11 is an inactive region in which the semiconductor layer is inactivated by ion implantation or the like. That is, the active region 11 is a region in which the semiconductor layer 10b in the substrate 10 is activated, and the inactive region is a region in which the semiconductor layer 10b is inactivated. Source fingers 12, gate fingers 14 and drain fingers 16 are provided on the active region 11 on the front surface 15 of the substrate 10. A gate bus bar 24 and a drain bus bar 26 are provided on an inactive region on the front surface 15 of the substrate 10. Thereby, parasitic capacitances caused by the gate bus bar 24 and the drain bus bar 26 can be suppressed. The planar shape of each of the source finger 12, the gate finger 14, and the drain finger 16 is rectangular and extends in the X direction. That is, the long side of each finger extends in the X direction, and the short side extends in the Y direction. The source finger 12, the gate finger 14, and the drain finger 16 are arranged in the Y direction.

The source fingers 12 and the drain fingers 16 are alternately provided in the Y direction. The gate finger 14 is sandwiched between one source finger 12 and one single drain finger 16. The gate finger 14, the source finger 12 and the drain finger 16 sandwiching the gate finger 14 form one unit FET 35. Adjacent unit FETs 35 share the source finger 12 or the drain finger 16.

A via hole 22 is provided on the front surface 15 so as to be contained within the source finger 12. The planar shape of the via hole 22 is substantially elliptical. A long axis direction of the via hole 22 is the X direction. One or a plurality of via holes 22 are provided in the extending direction of one source finger 12.

Ends closer to a short side 30a of both ends of the plurality of drain fingers 16 are commonly connected to the drain bus bar 26. Ends closer to a short side 30b of both ends of the plurality of gate fingers 14 are commonly connected to the gate bus bar 24. This provides a common potential to the plurality of drain fingers 16 and a common potential to the plurality of gate fingers 14. The plane shapes of the gate bus bar 24 and the drain bus bar 26 are substantially rectangular, and the gate bus bar 24 and the drain bus bar 26 extend in the Y direction.

Figure 2:
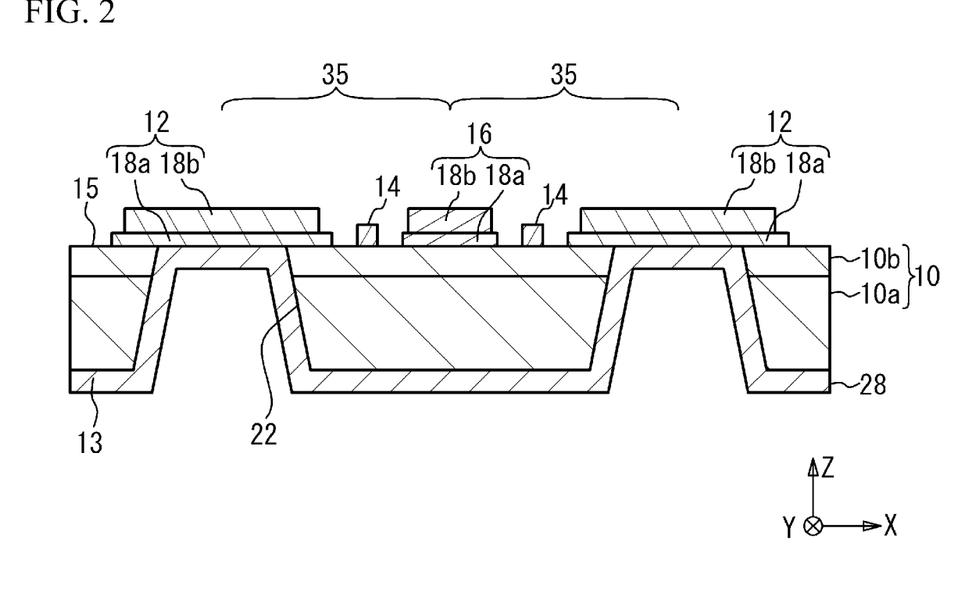
FIG. 2 is a cross-sectional view taken along line A-A of FIG. 1.

FIG. 2 is a cross-sectional view taken along line A-A of FIG. 1. As illustrated in FIG. 2, the substrate 10 includes a substrate 10a and a semiconductor layer 10b provided on the substrate 10a. The source finger 12, the gate finger 14 and the drain finger 16 are provided on the semiconductor layer 10b. Each of the source finger 12 and the drain finger 16 includes an ohmic metal layer 18a and a low resistance layer 18b that are provided on the semiconductor layer 10b. The ohmic metal layer 18a is in ohmic contact with the semiconductor layer 10b. The material of the low resistance layer 18b has a lower resistivity than the material of the ohmic metal layer 18a. The low resistance layer 18b is thicker than the ohmic metal layer 18a. As a result, the sheet resistance of the low resistance layer 18b is lower than that of the ohmic metal layer 18a. The low resistance layer 18b may not be provided. Each via hole 22 penetrates substrate 10 and is connected to source finger 12. When viewed from the thickness direction (Z direction) of the substrate 10, a region where the via hole 22 is connected to the source finger 12 is contained within the source finger 12. That is, the via hole 22 is not provided outside the source finger 12 on the front surface 15. A metal layer 28 is provided on the rear surface 13 of the substrate 10 and an inner surface of the via hole 22. The metal layer 28 is connected to the source finger 12. This provides the same potential to the plurality of source fingers 12.

When the semiconductor device is, for example, a nitride semiconductor device, the substrate 10a is, for example, an SiC substrate, a silicon substrate, a GaN substrate or a sapphire substrate. The semiconductor layer 10b includes, for example, a nitride semiconductor layer such as a GaN layer, an AlGaN layer and/or an InGaN layer. When the semiconductor device is, for example, a GaAs-based semiconductor device, the substrate 10a is, for example, a GaAs substrate. The semiconductor layer 10b includes, for example, an arsenide semiconductor layer such as a GaAs layer, an AlGaAs layer and/or an InGaAs layer. The ohmic metal layer 18a of each of the source finger 12, the drain finger 16 and the drain bus bar 26 includes, for example, an adhesive film (for example, a titanium film) and an aluminum film laminated in this order from a substrate 10 side. The low resistance layer 18b is, for example, a gold layer. Each of the gate finger 14 and the gate bus bar 24 is a metal film, and includes, for example, an adhesive film (e.g., a nickel film) and a gold film laminated in this order from the substrate 10 side. The gate busbar 24 is the same metal film as the gate finger 14. The metal layer 28 includes, for example, an adhesion layer and a gold layer laminated in this order from the substrate 10 side.

The length of the gate finger 14 in the Y direction is a gate length and is, for example, 0.05 μm to 5 μm. The width of the active region 11 in the X direction is a gate width of the unit FET 35, and is, for example, 50 μm to 1000 μm. The width of the source finger 12 in the Y direction is, for example, 50 μm to 200 μm, and the width of the drain finger 16 in the Y direction is, for example, 5 μm to 500 μm. The thickness of the substrate 10 is, for example, 10 μm to 500 μm.

First Comparative Example

Figure 3:
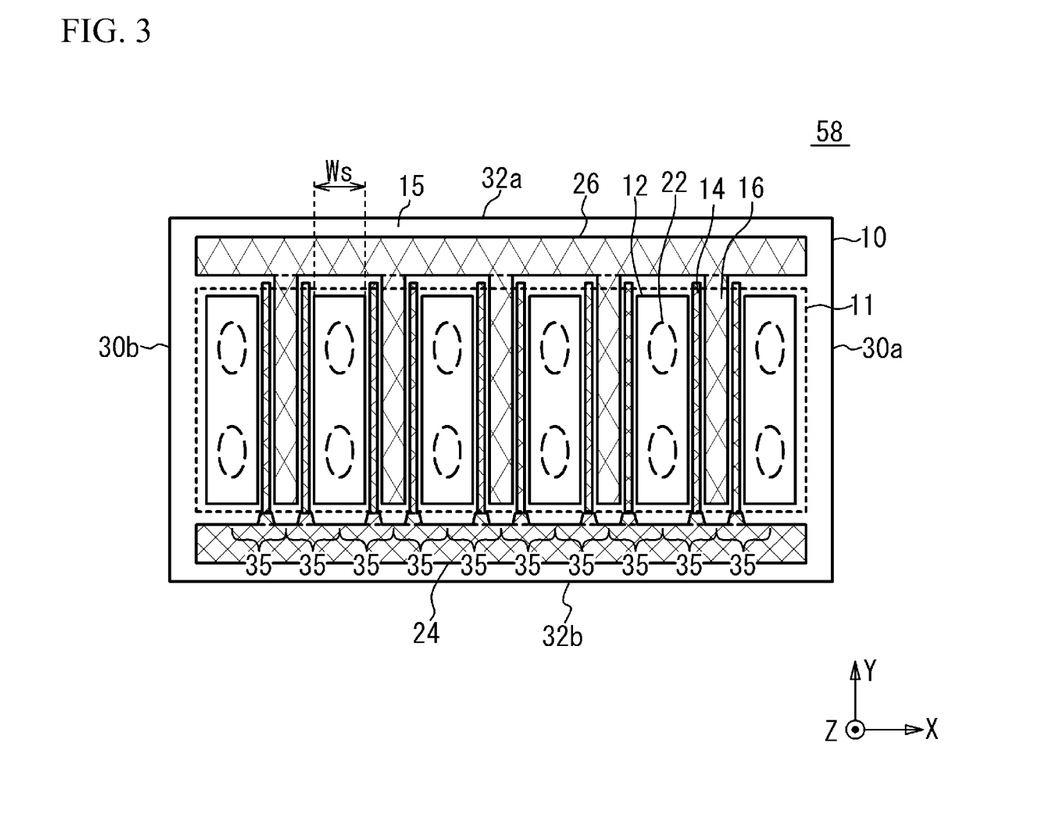
FIG. 3 is a plan view illustrating a semiconductor device according to a first comparative example.

FIG. 3 is a plan view illustrating a semiconductor device according to a first comparative example. As illustrated in FIG. 3, in the semiconductor device 58 of a first comparative Example, the source finger 12, the gate finger 14, and the drain finger 16 extend in the Y direction. The plurality of unit FETs are arranged in the X direction. Ends closer to the long side 32a of both ends of the plurality of drain fingers 16 are commonly connected to the drain bus bar 26, and ends closer to the long side 32b of both ends of the plurality of gate fingers 14 are commonly connected to the gate bus bar 24. The long axis of the via hole 22 extends in the Y direction. Other configurations are the same as those of the first embodiment, and the description thereof is omitted.

First Modification of First Embodiment

Figure 4:
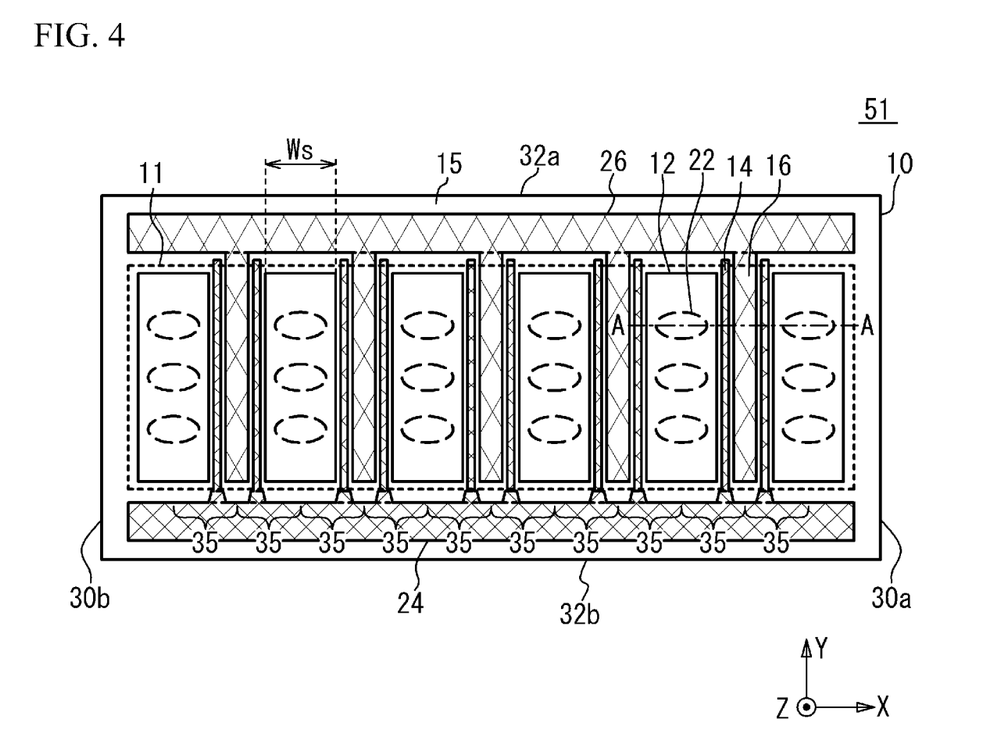
FIG. 4 is a plan view illustrating a semiconductor device according to a first modification of the first embodiment.

FIG. 4 is a plan view illustrating a semiconductor device according to a first modification of the first embodiment. As illustrated in FIG. 4, in the semiconductor device 51 according to the first modification of the first embodiment, the long axis of the via hole 22 extends in the X direction. Other configurations are the same as those of first comparative Example, and the description thereof will be omitted.

Figure 5A:
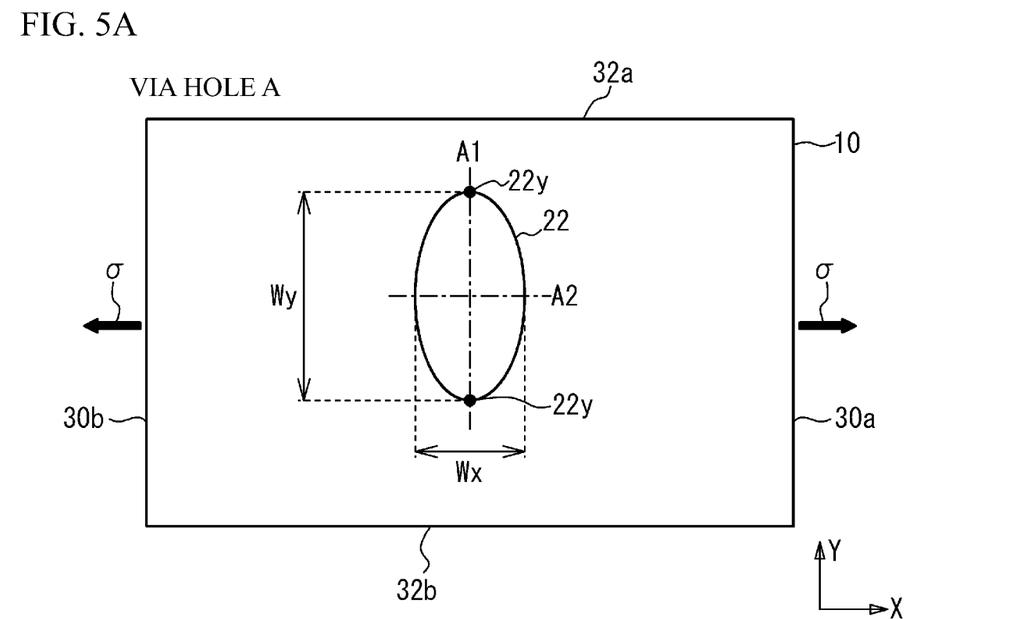
FIG. 5A is a plan view illustrating a via hole A.
Figure 5B:
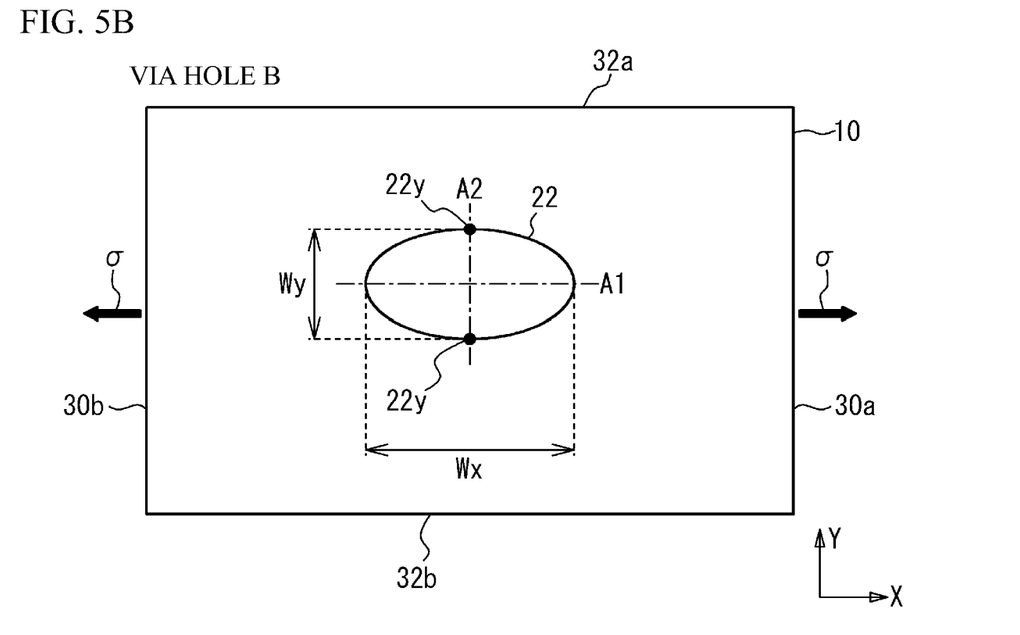
FIG. 5B is a plan view illustrating a via hole B.

FIG. 5A is a plan view illustrating a via hole A, and FIG. 5B is a plan view illustrating a via hole B. FIGS. 5A and 5B illustrate one via hole 22 in the substrate 10. As illustrated in FIGS. 5A and 5B, the via holes A and B are the via holes 22 according to first comparative example and first modification of first embodiment, respectively. The planar shape of the via hole 22 is elliptical. In the via hole A, the extension direction of a long axis A1 is the Y direction in which the short sides 30a and 30b extend, and the extension direction of a short axis A2 is the X direction in which the long sides 32a and 32b extend. The maximum widths of the via holes 22 in the X and Y directions are denoted by Wx and Wy, respectively. When stress is applied to the substrate 10 due to thermal stress or the like, the stress in the X direction in which the long sides 32a and 32b extend is larger than the stress in the Y direction. The stress in the X direction is defined as σ. The stress applied to the via hole 22 is maximum at ends 22y in the Y direction. The stress at the ends 22y is σ (1+2wy/Wx). A stress as large as the stress applied to the ends 22y is not applied to the end of the via hole 22 in the X direction.

In the via hole B, the extension direction of the long axis A1 is the X direction in which the long sides 32a and 32b are extended, and the extension direction of the short axis A2 is the Y direction in which the short sides 30a and 30b are extended. The maximum widths of the via holes 22 in the X and Y directions are denoted by Wx and Wy, respectively. Similar to the via hole A, stress σ is mainly applied to the substrate. At this time, the stress at the ends 22y is σ (1+2wy/Wx). Since Wy/Wx of the via hole B is smaller than that of the via hole A, the stress applied to the ends 22y of the via hole B is smaller than that of the via hole A. Therefore, in the via hole B, the possibility of occurrence of a crack in the substrate 10 starting from the via hole 22 becomes low, and the possibility of breakage of the substrate 10 becomes low.

Figure 6A:
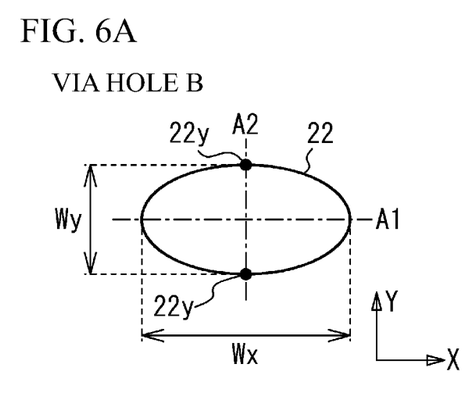
FIGS. 6A to 6E are plan views illustrating examples of planar shapes of via holes.
Figure 6B:
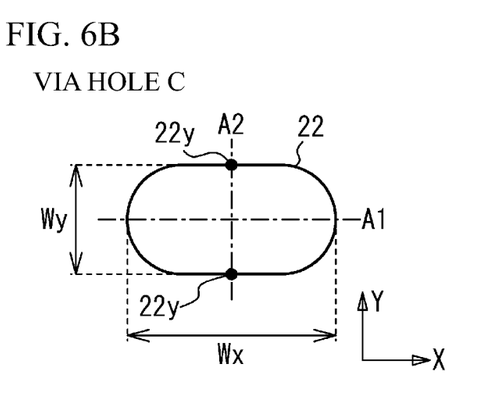
Figure 6C:
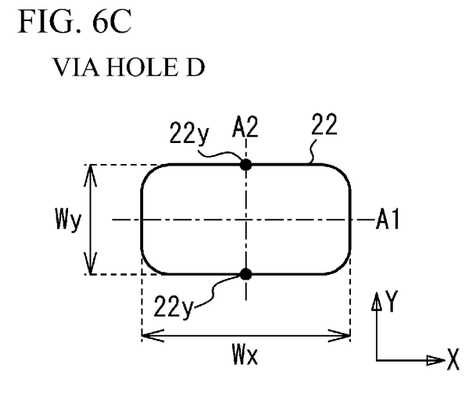
Figure 6D:
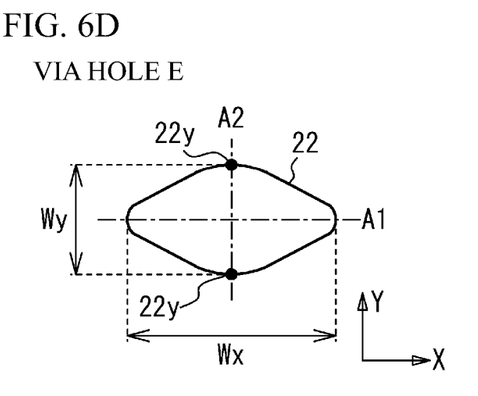
Figure 6E:
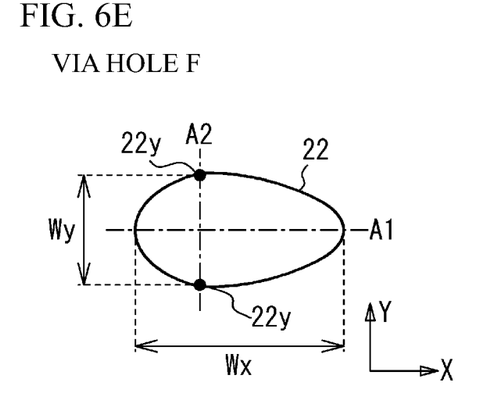

FIGS. 6A to 6E are plan views illustrating examples of the planar shape of the via hole. As illustrated in FIGS. 5B and 6A, the planar shape of the via hole B is an elliptical shape or an oblong shape. The planar shape of a via hole C is a rounded rectangular shape or a track shape, and has a rectangle having two sides extending in the X direction and semicircles connected to the rectangle at both ends of the rectangle in the X direction. The planar shape of a via hole D is a rounded rectangular shape with rounded corners. The planar shape of a via hole E is a rounded diamond shape in which the corners of the diamond are rounded. Each of the via holes holes C to E is a rounded polygonal shape in which the corners of the polygon are rounded. The planar shape of a via hole F is an egg shape.

In FIGS. 5A and 5B, the case where the planar shape of the via hole 22 is an elliptical shape has been described as an example, but as with the via holes B to F, the via hole 22 should be the planar shape such that the maximum width Wx in the X direction is larger than the maximum width Wy in Y direction. Thus, the stress at the ends 22y of the via hole 22 can be suppressed. Wx is preferably 1.5 times or more of Wy, and more preferably 2 times or more. If Wx/Wy is too large, the curvature of the outer periphery of the via hole 22 at the ends of the via hole 22 in the X direction becomes small, and therefore the stress becomes large. From this point of view, Wx is preferably 10 times or less of Wy. The width Wx is, for example, 10 μm to 500 μm, and the width Wy is, for example, 10 μm to 500 μm.

As in the via holes B to F, the planar shape of the via hole 22 is the elliptical shape, the oblong shape, the rounded polygonal shape, or the egg shape. As a result, there is no place where stress is concentrated on the outer periphery of the via hole 22, and the breakage of the substrate 10 can be suppressed. It should be noted that the elliptical shape, the oblong shape, the rounded polygonal shape or the egg shape may not be a geometric elliptical shape, a geometric oblong shape, a geometric rounded polygonal shape or a geometric egg shape. The planar shape of the via hole 22 is preferably linearly symmetrical with respect to the major axis A1 and the minor axis A2. Thereby, the stress applied to the via hole 22 can be made uniform, and the maximum stress applied to the via hole 22 can be suppressed. As in the via holes B to F, the planar shape of the via hole 22 is preferably a line symmetrical shape with respect to the long axis A1. Thereby, the stress applied to the via hole 22 can be made uniform, and the maximum stress applied to the via hole 22 can be suppressed. It is preferable that the curvature of the outer circumference at the ends 22y of the via hole 22 in the Y direction is the smallest (that is, the radius of curvature is the largest) in the outer circumference of the via hole 22. When the ends 22y is a straight line as in the via holes C and D, the curvature is 0 (the radius of curvature is ∞).

According to the first embodiment and the first modification thereof, the via hole 22 overlaps the source finger 12 on the front surface 15 and penetrates the substrate 10, and the maximum width Wx in the X direction is larger than the maximum width Wy in the Y direction. Thereby, the stress at the ends 22y of the via hole 22 in the Y direction can be suppressed. Therefore, damage to the substrate 10, such as the introduction of cracks in the substrate 10, can be suppressed. The description of FIGS. 5A and 5 b is particularly applicable when the stress σ in the X direction is sufficiently larger than the stress in the Y direction. From this viewpoint, the lengths of the long sides 32a and 32b are preferably 1.2 times or more, more preferably 1.5 times or more, and still more preferably 2 times or more the lengths of the short sides 30a and 30b. If the long sides 32a and 32b are too long, the substrate 10 is likely to be damaged. From this point of view, the lengths of the long sides 32a and 32b are preferably 100 times or less the lengths of the short sides 30a and 30b.

As in the first modification of the first embodiment, the source finger 12, the drain finger 16 and the gate finger 14 may extend in the Y direction and may be arranged in the X direction. When the plurality of via holes 22 are arranged in the Y direction with respect to one source finger 12 as in the first comparative example, cracks are easily introduced into the substrate 10 in the Y direction. Therefore, the maximum width Wx of the via hole 22 in the X direction is made larger than the maximum width Wy of the via hole 22 in the Y direction. Thereby, cracks introduced into the substrate 10 can be suppressed.

In the first modification of the first embodiment, the width Wx of the via hole 22 in the X direction is larger than that in the first comparative example. Therefore, the width Ws of the source finger 12 in the X direction in the first modification of the first embodiment is larger than that in the first comparative example. Therefore, the size of the substrate 10 is increased and the size of the semiconductor device is increased.

In the first embodiment, as illustrated in FIG. 1, the source finger 12, the drain finger 16 and the gate finger 14 extend in the X direction and are arranged in the Y direction. Thereby, the width Ws of the source finger 12 in the first embodiment can be made substantially equal to that of the first comparative example. As a result, the size of the substrate 10 can be reduced and the size of the semiconductor device can be reduced.

Further, the drain bus bar 26 is connected to an end closer to the short side 30a of both ends of each of the plurality of drain fingers 16. The gate bus bar 24 is connected to an end closer to the short side 30b of both ends of each of the plurality of gate fingers 14. As a result, the same potential can be supplied to the drain fingers 16 of the plurality of unit FETs 35 in the FET group 34, and the same potential can be supplied to the gate fingers 14. Further, the size of the substrate 10 can be reduced.

As illustrated in FIG. 2, the metal layer 28 is provided on the rear surface 13 of the substrate 10 opposite to the front surface 15, and is electrically connected to the source finger 12 via the via hole 22. In this case, stress is applied to the via hole 22 due to thermal stress between the metal layer 28 in the via hole 22 and the substrate 10, and the substrate 10 is easily damaged. Therefore, it is preferable that the maximum width Wx of the via hole 22 in the X direction is made larger than the maximum width Wy in the Y direction.

Second Modification of First Embodiment

Figure 7:
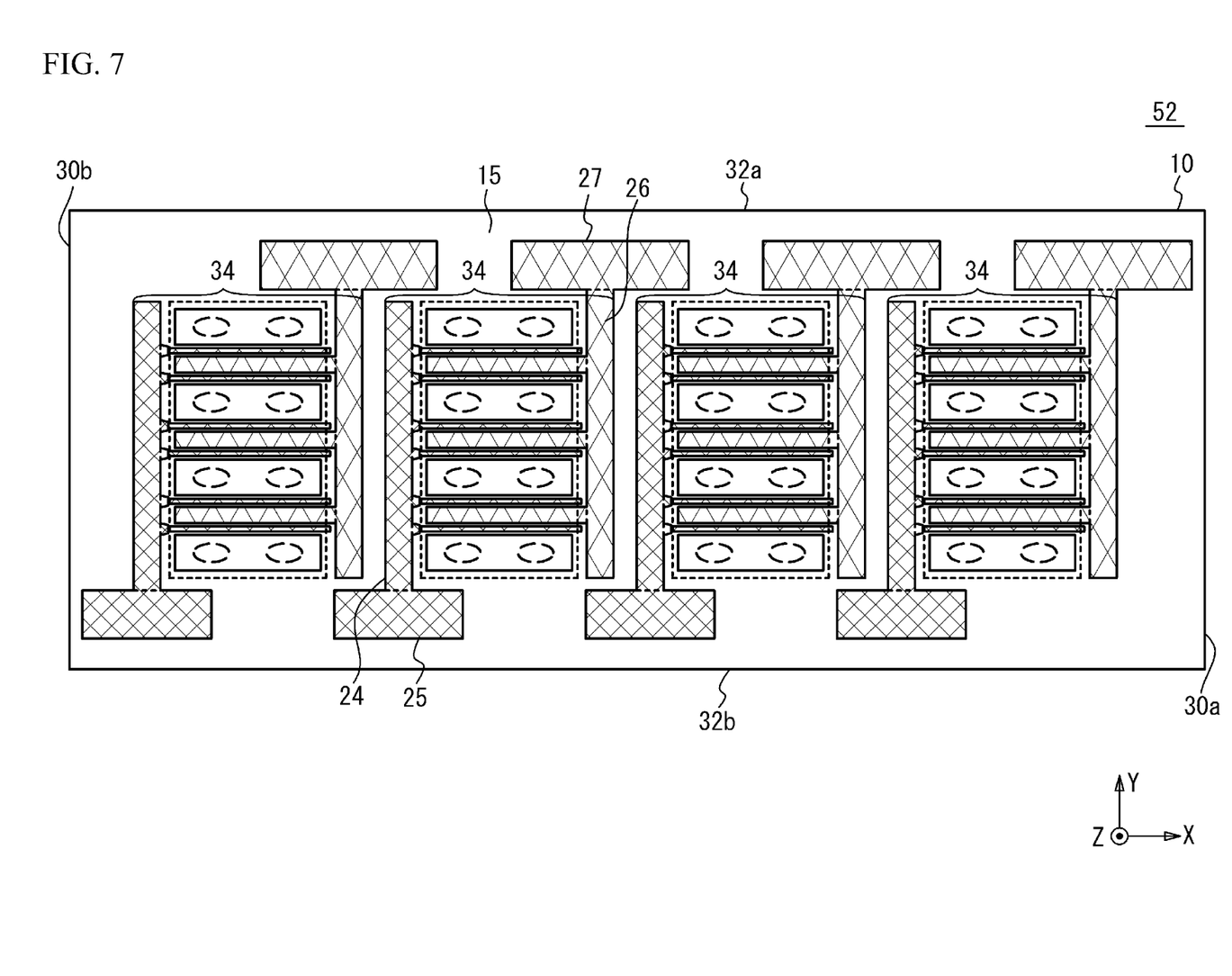
FIG. 7 is a plan view illustrating a semiconductor device according to a second modification of the first embodiment.

FIG. 7 is a plan view illustrating a semiconductor device according to a second modification of the first embodiment. As illustrated in FIG. 7, the plurality of FET groups 34 are arranged in the X direction. Drain pads 27 are provided on a region of the front surface 15 between the long side 32a and the FET group 34, and gate pads 25 are provided on a region of the front surface 15 between the long side 32b and the FET group 34. An end closer to the long side 32a of both ends of the drain bus bar 26 is connected to the drain pad 27, and the drain pad 27 and the drain bus bar 26 have the same potential. An end closer to the long side 32b of both ends of the gate bus bar 24 is connected to the gate pad 25, and the gate pad 25 and the gate bus bar 24 have the same potential. The drain pad 27 and the gate pad 25 are pads for electrically connecting the unit FET 35 to the outside.

In FIG. 7, one drain bus bar 26 is connected to one drain pad 27, and one gate bus bar 24 is connected to one gate pad 25. A plurality of drain bus bars 26 may be connected to one drain pad 27, and a plurality of gate bus bars 24 may be connected to one gate pad 25. The plurality of drain bus bars 26 on the substrate 10 may all be connected to one drain pad 27, and the plurality of gate bus bars 24 on the substrate 10 may all be connected to one gate pad 25.

In the second modification of the first embodiment, the end closer to the long side 32a of both ends of the drain bus bar 26 is connected to the drain pad 27. The end closer to the long side 32b of both ends of the gate bus bar 24 is connected to the gate pad 25. Thereby, the unit FET 35 can be electrically connected to the outside at the long sides 32a and 32b.

Second Embodiment

Figure 8:
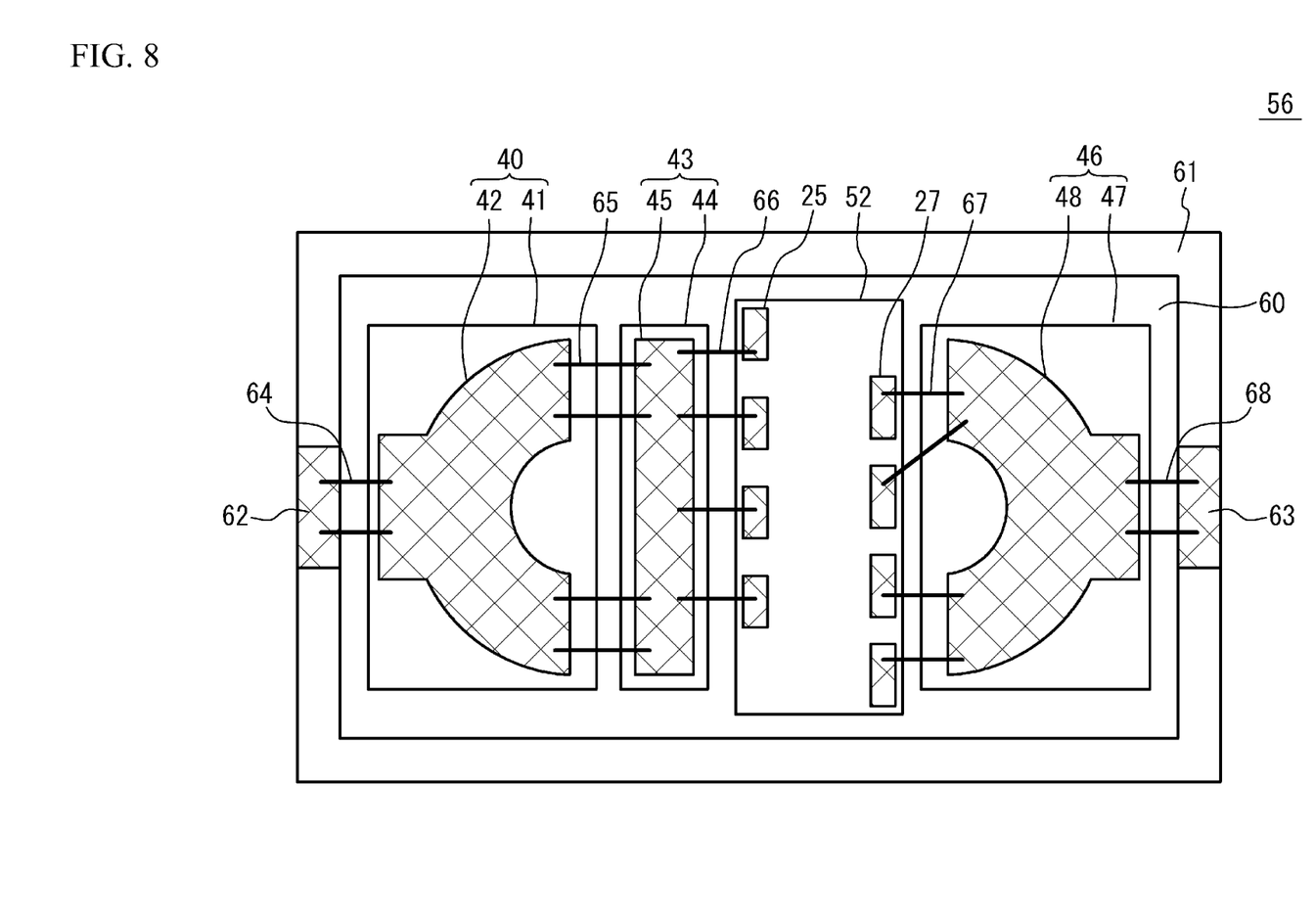
FIG. 8 is a plan view illustrating a semiconductor device according to a second embodiment.

The second embodiment is an example of a semiconductor device in which a semiconductor device 52 which is a semiconductor chip according to the second modification of the first embodiment is mounted in a package. FIG. 8 is a plan view illustrating the semiconductor device according to the second embodiment. As illustrated in FIG. 8, in a semiconductor device 56, an insulating frame 61 made of ceramics or the like is mounted on a base 60 made of a metal such as copper or the like. An input terminal 62 and an output terminal 63 are provided on the frame 61. Chips 40, 43, 46 and the semiconductor device 52 are mounted on the base 60. The chip 40 includes a dielectric layer 41, a conductor pattern 42 provided on the dielectric layer 41, and a conductor pattern (not illustrated) provided under the dielectric layer 41. The chip 43 includes a dielectric layer 44 and a conductor pattern 45 provided on the dielectric layer 44. The chip 46 includes a dielectric layer 47 and a conductor pattern 48 provided on the dielectric layer 47. The conductor patterns 42, 45 and 48, the input terminal 62, and the output terminal 63 are metal layers such as gold layers. The gate pads 25 and the drain pads 27 are provided on the semiconductor device 52. In FIG. 8, the FET group 34 is not illustrated.

The bonding wires 64 electrically connect the input terminal 62 and the conductor pattern 42. The bonding wires 65 electrically connect the conductor patterns 42 and 45. The bonding wires 66 electrically connect the conductor pattern 45 and the gate pads 25. The bonding wires 67 electrically connects the drain pads 27 and the conductor pattern 48. The bonding wires 68 electrically connect the conductor pattern 48 and the output terminal 63.

The conductor pattern 42 is a pattern for aligning the electrical lengths between the bonding wires 64 and 65. The conductor pattern 45 sandwiching the dielectric layer 44 and the conductor pattern under the dielectric layer 44 function as a shunt capacitor. The bonding wires 65 and 66 and the chip 43 form an input matching circuit. The conductor pattern 48 is a pattern for aligning the electrical lengths between the bonding wires 67 and 68. The high frequency signal input from the input terminal 62 is input to the semiconductor device 52 through the chips 40 and 43. The high frequency signal amplified in the semiconductor device 52 is output from the output terminal 63 through the chip 46. As in FIG. 7 of the second modification of the first embodiment, the gate pads 25 and the drain pads 27 are provided along the long sides 32b and 32a of the substrate 10. Therefore, the bonding wires 65 and 67 can be easily bonded to the gate pads 25 and the drain pads 27. As in the second embodiment, the semiconductor device according to the first embodiment and a variation thereof may have a configuration in which the semiconductor chips are mounted in the package.

Third Embodiment

Figure 9:
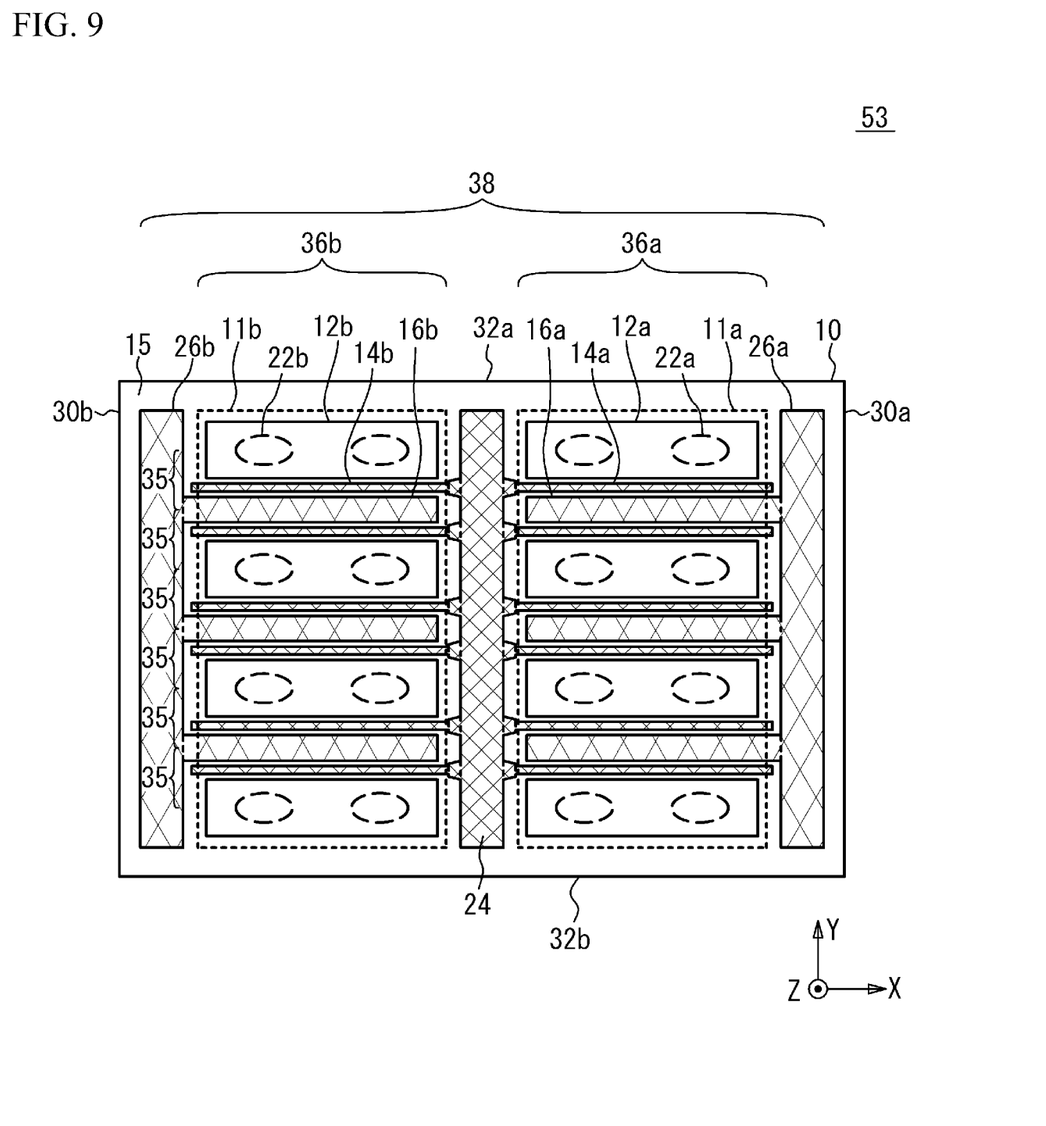
FIG. 9 is a plan view illustrating a semiconductor device according to a third embodiment.

FIG. 9 is a plan view illustrating a semiconductor device according to a third embodiment. As illustrated in FIG. 9, in a semiconductor device 53, a set 38 including FET groups 36a and 36b is provided. In the FET group 36a, a plurality of source fingers 12a, a plurality of gate fingers 14a and a plurality of drain fingers 16a are provided on an active region 11a, and via holes 22a are provided in the source finger 12a. In the FET group 36b, a plurality of source fingers 12b, a plurality of gate fingers 14b and a plurality of drain fingers 16b are provided on an active region 11b, and the via holes 22a are provided in the source finger 12b.

That is, the plurality of source fingers 12b (first source fingers) are arranged in the Y direction. The plurality of source fingers 12a (second source fingers) are arranged in the Y direction and are provided between the short side 30a and the plurality of source fingers 12b in the X direction. The plurality of drain fingers 16b (first drain fingers) are arranged in the Y direction. The plurality of drain fingers 16a (second drain fingers) are arranged in the Y direction and are provided between the short side 30a and the plurality of drain fingers 16b in the X direction. The plurality of gate fingers 14b (first gate fingers) are arranged in the Y direction. Each gate finger 14b is sandwiched between one of the source fingers 12b and one of the drain fingers 16b in the Y direction. The plurality of gate fingers 14a (second gate fingers) are arranged in the Y direction, are provided between the short side 30a and the plurality of gate fingers 14b in the X direction. Each gate finger 14a is sandwiched between one of the source fingers 12a and one of the drain fingers 16a in the Y direction.

In the FET groups 36a and 36b, the plurality of unit FETs 35 are arranged in the Y direction. The FET groups 36a and 36b are arranged in the X direction. One gate bus bar 24 is provided between the FET groups 36a and 36b. A drain bus bar 26a is provided between the short side 30a and the FET group 36a in the X direction, and a drain bus bar 26b is provided between the short side 30b and the FET group 36b in the X direction. An end closer to the short side 30a of both ends of each of the plurality of gate fingers 14b is connected to the gate bus bar 24, and an end closer to the short side 30b of both ends of each of the plurality of gate fingers 14a is connected to the gate bus bar 24. An end closer to the short side 30b of both ends of each of the plurality of drain fingers 16b is connected to the drain bus bar 26b (first drain bus bar). An end closer to the short side 30a of both ends of each of the plurality of drain fingers 16a is connected to the drain bus bar 26a (second drain bus bar). As a result, the number of gate bus bars 24 can be reduced as compared with the first embodiment. Therefore, the size of the substrate 10 can be reduced, and the size of the semiconductor device can be reduced. Other configurations are the same as those of the first embodiment, and the description thereof is omitted. A plurality of sets of FET groups 36a and 36b, the gate bus bar 24, the drain bus bars 26a and 26b, and the set 38 may be arranged in the X direction.

First Modification of Third Embodiment

Figure 10:
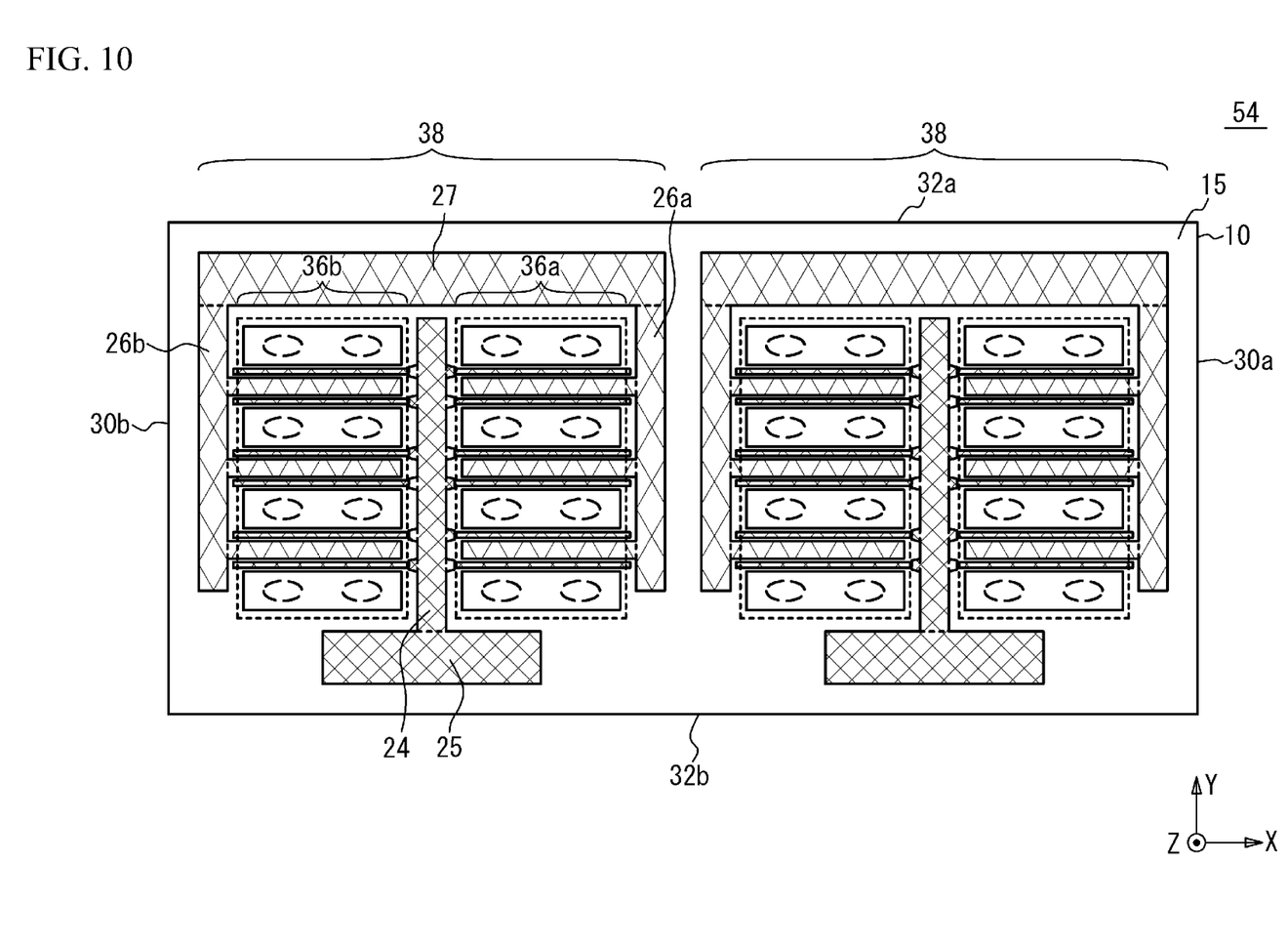
FIG. 10 is a plan view illustrating a semiconductor device according to a first modification of the third embodiment.

FIG. 10 is a plan view illustrating a semiconductor device according to a first modification of the third embodiment. As illustrated in FIG. 10, in a semiconductor device 54, a plurality of sets 38 are arranged in the X direction. The number of sets 38 arranged in the X direction may be one or three or more. In the set 38, the FET groups 36a and 36b, the gate bus bars 24, and the drain bus bars 26a and 26b of the third embodiment are provided. An end closer to the long side 32b of both ends of the gate bus bar 24 is connected to the gate pad 25. An end closer to the long side 32a of both ends of each of the drain bus bars 26a and 26b is connected to the drain pad 27. Thus, the unit FET 35 can be electrically connected to the outside at the long sides 32a and 32b. The drain pad to which the drain bus bar 26*a* is connected may be separated on the front surface 15 from the drain pad to which the drain bus bar 26*b* is connected. The adjacent drain bus bars 26*a* and 26*b* of the adjacent set 38 may be commonly provided as one drain bus bar. The other configuration is the same as that of the third embodiment, and the description thereof is omitted.

Second Modification of Third Embodiment

Figure 11:
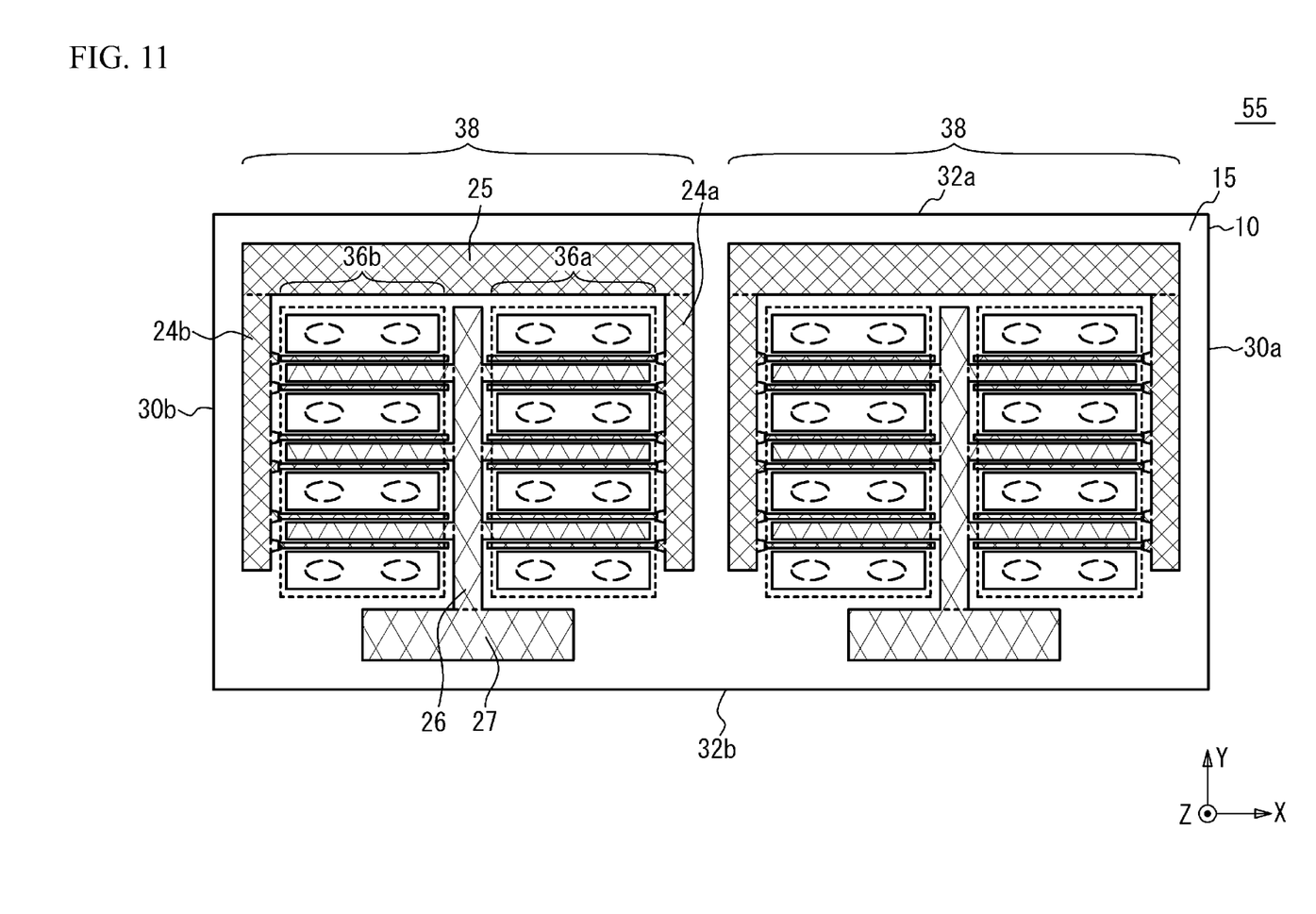
FIG. 11 is a plan view illustrating a semiconductor device according to a second modification of the third embodiment.

FIG. 11 is a plan view illustrating a semiconductor device according to a second modification of the third embodiment. As illustrated in FIG. 11, in a semiconductor device 55, an end closer to the short side 30*a* of both ends of each of the plurality of drain fingers in the FET group 36*b* is connected to the drain bus bar 26, and an end closer to the short side 30*b* of both ends of each of the plurality of drain fingers in the FET group 36*a* is connected to the drain bus bar 26. An end closer to the short side 30*b* of both ends of each of the plurality of gate fingers in the FET group 36*b* is connected to the gate bus bar 24*b* (first gate bus bar). An end closer to the short side 30*a* of both ends of each of the plurality of gate fingers in the FET group 36*a* is connected to the gate bus bar 24*a* (second gate bus bar). An end closer to the long side 32*b* of both ends of the drain bus bar 26 is connected to the drain pad 27. An end closer to the long side 32*a* of both ends of each of the gate bus bars 24*a* and 24*b* is connected to the gate pad 25. Other configurations are the same as those of the first modification of the third embodiment, and the description thereof will be omitted. As in the second modification of the third embodiment, one drain bus bar 26 may be provided between the FET groups 36*a* and 36*b*, and gate bus bars 24*a* and 24*b* may be provided so as to sandwich the FET groups 36*a* and 36*b*.

The embodiments disclosed here should be considered illustrative in all respects and not restrictive. The present disclosure is not limited to the specific embodiments described above, but various variations and changes are possible within the scope of the gist of the present disclosure as described in the claims.

What is claimed is:

1. A semiconductor device comprising:
   a substrate having a front surface including a first long side and a second long side extending in a first direction and opposed to each other, and a first short side and a second short side extending in a second direction intersecting the first direction and opposed to each other;
   a source finger provided on the front surface;
   a drain finger provided on the front surface;
   a gate finger provided on the front surface and sandwiched between the source finger and the drain finger; and
   a drain bus bar provided on the front surface and connected to a first drain end of each of a plurality of drain fingers, and the first drain end being an end of each of the plurality of drain fingers closer to the first short side than the second short side; and
   a gate bus bar provided on the front surface and connected to a first gate end of each of a plurality of gate fingers, and the first gate end being an end of each of the plurality of gate fingers closer to the second short side than the first short side;
   wherein:
   a via hole penetrating the substrate is provided in the substrate, a region where the via hole is connected to the source finger in the front surface is contained within the source finger, and the via hole has a maximum width in the first direction larger than a maximum width in the second direction,
   the source finger, the drain finger, and the gate finger extend in the first direction and are arranged in the second direction,
   the substrate includes an active region in which a semiconductor layer in the substrate is activated, and an inactive region in which the semiconductor layer is inactivated, and
   the source finger, the drain finger and the gate finger are provided on the active region, and the drain bus bar and the gate bus bar are provided on the inactive region.

2. The semiconductor device as claimed in claim 1, further comprising:
   a drain pad provided on the front surface and connected to a first drain bus end of the drain bus bar, and the first drain bus end being an end of the drain bus bar that is closer to the second long side than the first long side; and
   a gate pad provided on the front surface and connected to a first gate bus end of the gate bus bar, and the first gate bus end being an end of the gate bus bar that is closer to the first long side than the second long side.

3. The semiconductor device as claimed in claim 1, wherein
   a planar shape of the via hole is an elliptical shape, an oblong shape, an egg shape, or a rounded square shape.

4. The semiconductor device as claimed in claim 1, further comprising a metal layer provided on a rear surface of the substrate opposite to the front surface and electrically connected to the source finger via the via hole.

5. A semiconductor device comprising:
   a substrate having a front surface including a first long side and a second long side extending in a first direction and opposed to each other, and a first short side and a second short side extending in a second direction intersecting the first direction and opposed to each other;
   a source finger provided on the front surface, wherein the source finger includes a plurality of first source fingers arranged in the second direction, and a plurality of second source fingers arranged in the second direction and provided between the first short side and the plurality of first source fingers;
   a drain finger provided on the front surface, wherein the drain finger includes a plurality of first drain fingers arranged in the second direction, and a plurality of second drain fingers arranged in the second direction and provided between the first short side and the plurality of first drain fingers;
   a gate finger provided on the front surface and sandwiched between the source finger and the drain finger, wherein the gate finger includes a plurality of first gate fingers arranged in the second direction, each of the first gate fingers being sandwiched between one of the plurality of first source fingers and one of the plurality of first drain fingers in the second direction, and a plurality of second gate fingers arranged in the second direction and provided between the first short side and the plurality of first gate fingers, each of the second gate fingers being sandwiched between one of the plurality of second source fingers and one of the plurality of second drain fingers in the second direction; and
   a gate bus bar connected to a first gate end of each of the plurality of first gate fingers and a second gate end of each of the plurality of second gate fingers, wherein the first gate end is an end of each of the plurality of first gate fingers closer to the first short side than the second short side, and wherein the second gate end is an end of each of the plurality of second gate fingers closer to the second short side than the first short side;
a first drain bus bar connected to a first drain end of each of the plurality of first drain fingers, wherein the first drain end is an end of each of the plurality of first drain fingers closer to the second short side than the first short side; and
a second drain bus bar connected to a second drain end of each of the plurality of second drain fingers, wherein the second drain end is an end of each of the plurality of second drain fingers closer to the first short side than the second short side, wherein:
a via hole penetrating the substrate is provided in the substrate, a region where the via hole is connected to the source finger in the front surface is contained within the source finger, and the via hole has a maximum width in the first direction larger than a maximum width in the second direction,
the source finger, the drain finger, and the gate finger extend in the first direction and are arranged in the second direction.

6. The semiconductor device as claimed in claim 5, wherein
the substrate includes an active region in which a semiconductor layer in the substrate is activated, and an inactive region in which the semiconductor layer is inactivated, and
the source finger, the drain finger and the gate finger are provided on the active region, and the first drain bus bar and the gate bus bar are provided on the inactive region.

7. A semiconductor device comprising:
a substrate having a front surface including a first long side and a second long side extending in a first direction and opposed to each other, and a first short side and a second short side extending in a second direction intersecting the first direction and opposed to each other;
a source finger provided on the front surface, wherein the source finger includes a plurality of first source fingers arranged in the second direction, and a plurality of second source fingers arranged in the second direction and provided between the first short side and the plurality of first source fingers;
a drain finger provided on the front surface, wherein the drain finger includes a plurality of first drain fingers arranged in the second direction, and a plurality of second drain fingers arranged in the second direction and provided between the first short side and the plurality of first drain fingers,
a gate finger provided on the front surface and sandwiched between the source finger and the drain finger, wherein the gate finger includes a plurality of first gate fingers arranged in the second direction, each of the first gate fingers being sandwiched between one of the plurality of first source fingers and one of the first drain fingers in the second direction, and a plurality of second gate fingers arranged in the second direction and provided between the first short side and the plurality of first gate fingers, each of the second gate fingers being sandwiched between one of the plurality of second source fingers and one of the plurality of second drain fingers in the second direction,
a drain bus bar connected to a first drain end of each of the plurality of first drain fingers and a second drain end of both ends of each of the plurality of second drain fingers, wherein the first drain end is an end of each of the plurality of first drain fingers closer to the first short side than the second short side, and wherein the second drain end is an end of each of the plurality of second drain fingers closer to the second short side than the first short side;
a first gate bus bar connected to a first gate end of each of the plurality of first gate fingers, wherein the first gate end is an end of each of the plurality of first gate fingers closer to the second short side than the first short side; and
a second gate bus bar connected to a second gate end of each of the plurality of second gate fingers, wherein the second gate end is an end of each of the plurality of second gate fingers closer to the first short side than the second short side, and wherein:
a via hole penetrating the substrate is provided in the substrate, a region where the via hole is connected to the source finger in the front surface is contained within the source finger, and the via hole has a maximum width in the first direction larger than a maximum width in the second direction, and
the source finger, the drain finger, and the gate finger extend in the first direction and are arranged in the second direction.

8. A semiconductor device comprising:
a substrate having a front surface including a first long side and a second long side extending in a first direction and opposed to each other, and a first short side and a second short side extending in a second direction intersecting the first direction and opposed to each other;
a source finger provided on the front surface;
a drain finger provided on the front surface; and
a gate finger provided on the front surface and sandwiched between the source finger and the drain finger; wherein:
a via hole penetrating the substrate is provided in the substrate, a region where the via hole is connected to the source finger in the front surface is contained within the source finger, and the via hole has a maximum width in the first direction larger than a maximum width in the second direction,
the source finger, the drain finger, and the gate finger extend in the first direction and are arranged in the second direction, and
a plurality of via holes are arranged in the second direction in one the source finger.

9. The semiconductor device as claimed in claim 8, further comprising:
a drain bus bar provided on the front surface and connected to a first drain end of each of a plurality of drain fingers, and the first drain end being an end of each of the plurality of drain fingers closer to the first short side than the second short side; and
a gate bus bar provided on the front surface and connected to a first gate end of each of a plurality of gate fingers, and the first gate end being an end of each of the plurality of gate fingers closer to the second short side than the first short side.

* * * * *